United States Patent [19]

Madrazo et al.

[11] 3,727,072

[45] Apr. 10, 1973

[54] INPUT CIRCUIT FOR MULTIPLE EMITTER TRANSISTOR

[75] Inventors: Charles Felix Madrazo; Robert George Saenz, both of Palm Beach, Fla.

[73] Assignee: RCA Corporation, Princeton, N.J.

[22] Filed: Nov. 9, 1971

[21] Appl. No.: 196,890

[52] U.S. Cl. ....................307/218, 307/299 A

[51] Int. Cl. ....................H03k 17/00

[58] Field of Search ....................307/299 A, 210; 317/235 Z, 235

[56] References Cited

UNITED STATES PATENTS

| | | | |
|---|---|---|---|
| 3,641,362 | 2/1972 | Gable | 307/300 |
| 3,138,721 | 6/1964 | Kilby | 317/235 |

OTHER PUBLICATIONS

Sylvania Application Note No. 14 Elec. Disposition of Unused Shield Input Terminals, J. Rienzo 12/67

*Primary Examiner*—John W. Huckert
*Assistant Examiner*—B. P. Davis
*Attorney*—H. Christoffersen

[57] ABSTRACT

The emitter electrodes of a multiple emitter transistor are coupled to ground by one set of diodes and to the supply voltage terminal through resistors and another set of diodes. The emitter electrodes serve as input terminals to a circuit such as a transistor-transistor logic ($T^2L$) circuit. In the absence of input signals, the resistors and the second set of diodes maintain these input terminals at a fixed voltage level providing high speed, and high noise immunity performance. The second set of diodes insures that undesired currents do not flow through the resistors.

7 Claims, 6 Drawing Figures

INVENTORS
Charles F. Madrazo and
Robert G. Saenz.
BY
ATTORNEY

INVENTORS.
Charles F. Madrazo and
Robert G. Saenz.
BY
ATTORNEY

INPUT CIRCUIT FOR MULTIPLE EMITTER TRANSISTOR

BACKGROUND OF THE INVENTION

FIG. 1 shows the input circuit to a widely used $T^2L$ integrated circuit. Transistor 10 is a multiple emitter transistor and is shown to include three emitters 12, 14 and 16. (This is an example only; in practice, there may be two, three, four or more emitters.) These emitters serve as input terminals for three signals A, B and C and are connected to ground by three diodes 18, 20 and 22. The base 24 of transistor 10 is connected through resistor 26 to a terminal 28 for supply voltage $+V_{CC}$. The collector 30 of transistor 10 is connected to another transistor stage. In this particular example, the collector is shown connected to the base of transistor 32. There are a number of additional transistors in the integrated circuit package; however, since neither they nor transistor 32 are of particular interest in the present discussion, they will not be mentioned again.

The circuit of FIG. 1 operates in a perfectly satisfactory manner when all three input signals are used. In operation, if all three signals A, B and C are at a relatively high value — are relatively positive and, for example, close in value to $+V_{CC}$, then transistor 10 turns off. If any one of A, B or C is at a relatively low value such as at ground potential, then transistor 10 goes on.

In the case in which the logic designer does not desire a signal to be applied to one of the terminals, problems arise. Assume, for example, that terminal C is left floating. If one of the other terminals receives a signal which is relatively low, the distributed capacitance, shown in phantom view at 34, connected to the emitter electrode 16, tends to charge to this relatively low value, that is, the input terminal tends to float to the relatively low value. The charging path may include the leakage current path from emitter electrode 14 to emitter electrode 16. When at a later time the signals A and B go high, the relatively low voltage present at the distributed capacitance 34 prevents the transistor from turning off immediately. Thus, if there is an unused electrode which remains floating, it slows down the circuit operation. In addition, with transistor 10 off, the voltage on the distributed capacitance 34 may float to the threshold voltage level, thus reducing the circuit noise immunity and in this case a noise signal may possibly trigger the transistor 10 to the "on" condition. This, of course, also is an undesirable mode of operation.

There are a number of solutions to the problem above but each does have some disadvantages. One solution is to directly connect an unused input terminal to a used terminal. For example, if terminal C is an unused terminal, it may be connected directly to terminal B. This solution is perfectly satisfactory for the case of a limited number of emitter electrodes. It has been found, in practice, that two such terminals may be connected together without seriously affecting the circuit operation. However, when three or more emitter terminals are directly connected together, the input capacitance present at this common connection becomes larger and this increased load for the input or driving signal slows down the circuit. The added loading also means that the number of stages the driver can control is reduced (the driver "fan-out" is reduced). Finally, additional connections increase the possibility of wiring errors.

Another solution to the problem above is to bring the unused circuit terminal to a terminal external of the chip such as one on the back plane of say a basic processing unit (BPU) computer chassis. Thereafter, this terminal may be tied through a relatively large value of resistance to a supply voltage terminal such as $+V_{CC}$. However, this too has been found to be bothersome for a number of reasons. For one thing, this means extra wires and in some cases, such as in backplane wiring, there are already a very large number of wires present and the additional ones introduce layout and wiring problems. In addition, there is the added expense of doing the wiring and connecting the resistor.

Another solution to the problem is to add the resistors to the integrated circuit connected between the emitter and the $+V_{CC}$ terminal. One disadvantage of this approach is that the resistors have to be of quite large value to prevent excessive current from being drawn when a used input terminal goes low. A large value of resistance means, in the case of so-called "diffused" resistors (shown in FIG. 3), a relatively large amount of chip area. In the first place this chip area generally cannot be readily spared and in the second place the expense of a chip goes up roughly proportionately to the extra area which is needed. It is preferred to use diffused resistors because their value accurately can be controlled. One could reduce the chip area required by employing so-called "punch" resistors (shown in FIG. 4) but in the present state of the technology their value cannot accurately be predicted. Other problems with this approach are discussed in more detail later.

SUMMARY OF THE INVENTION

The present invention resides in part in the recognition that under certain operating conditions, when the last solution discussed above is attempted, additional problems sometimes are introduced. It is found that when the driver circuit is powered from a different power supply then the driven circuit containing the circuit elements discussed, if the power supply for the driven circuit is turned off while the power supply for the driver circuit remains on, the power supply for the driven circuit, when it is turned on again, may not produce a voltage at the required level. Under these conditions, there is a relatively large current flowing from the power supply for the driver circuit and the resulting reduction in voltage at the driver circuit output is sometimes found to cause improper operation of other circuits (such as 17 of FIG. 5) operating from this same power supply. This large current also may result in damage to certain components of the driven circuit. The present inventors have discovered the reasons for this unexpected performance, as will be discussed in detail later, and have provided a solution to this problem.

A circuit embodying the invention includes a multiple emitter transistor and a plurality of first diodes, each connected to a different emitter, each poled in the reverse direction relative to the emitter-to-base diode to which it is connected, and each connected between an emitter and a point of reference potential. The circuit also includes a plurality of second diodes, each second diode connected like-electrode-to-like-electrode to a different one of the first diodes. The circuit also includes a plurality of direct current impedances, all connected at one terminal to a voltage supply terminal and connected at each other terminal to another electrode of a different one of said second diodes.

Figure 1:
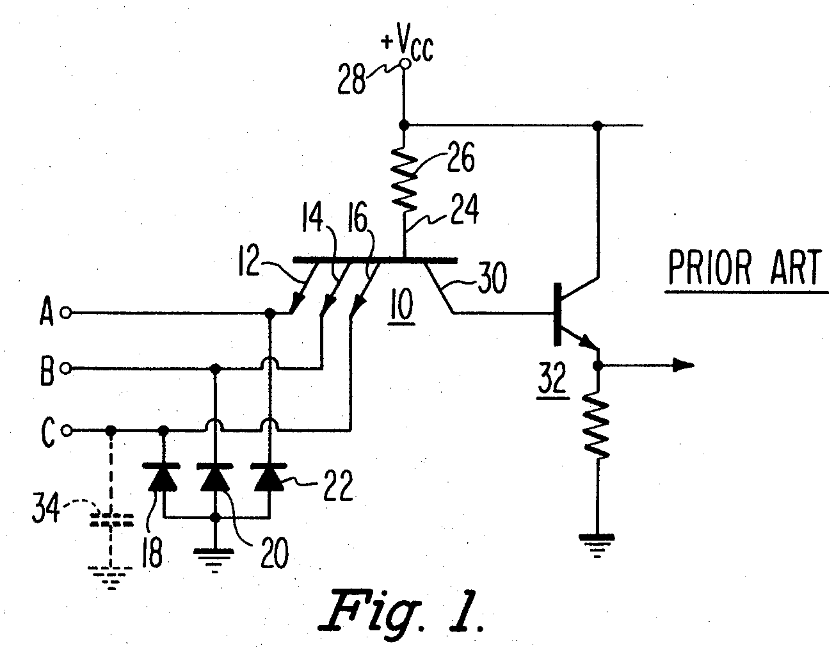
FIG. 1 is a schematic circuit diagram of a prior art multiple-emitter transistor circuit.
Figure 2:
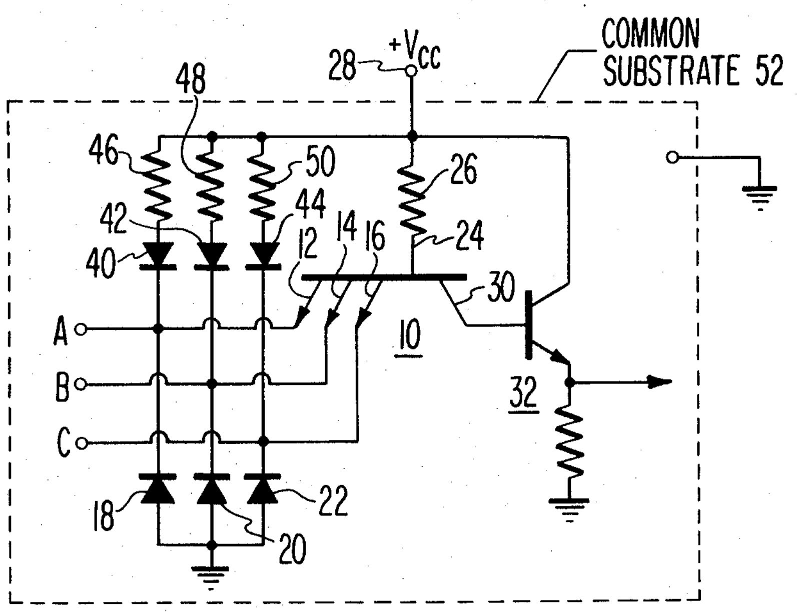
FIG. 2 is a schematic circuit diagram of a multiple-emitter transistor input circuit according to a preferred embodiment of the invention.

Circuit elements in FIG. 2 corresponding in structure and function to circuit elements of FIG. 1 are similarly legended.

DETAILED DESCRIPTION

Figure 5:
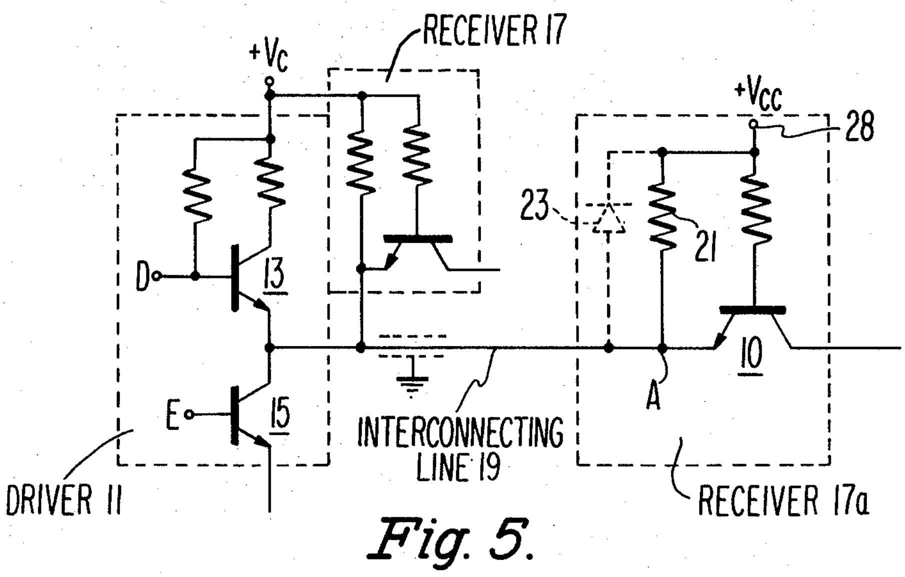
FIG. 5 is a schematic circuit diagram which illustrates a problem discovered and solved in the present invention.

An understanding of the contribution of the present invention requires a more detailed explanation of problems discovered by the applicants when the known approach, discussed at the last part of the background of the invention section, was investigated. The circuit is shown in FIG. 5. In this particular system, the driver circuit 11, includes a pair of n-p-n transistors 13 and 15. This circuit is connected to a first receiver 17 and a second receiver 17*a*. The driver circuit 11 and receiver 17 are powered from one power supply $+V_C$ and the second receiver is powered by a second power supply $+V_{CC}$. The driver circuit is connected to the receiver circuit 17*a* by an interconnecting line such as a shielded conductor 19.

Figure 3:
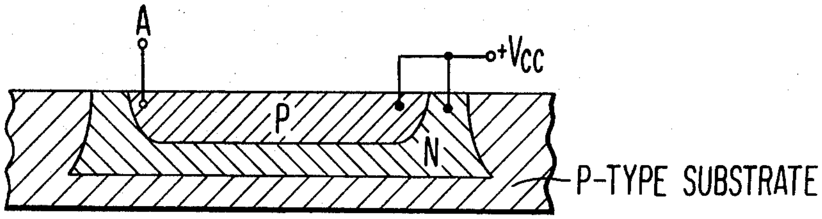
FIGS. 3 and 4 are sections through known integrated circuit resistors which may be employed in the present invention.
Figure 4:
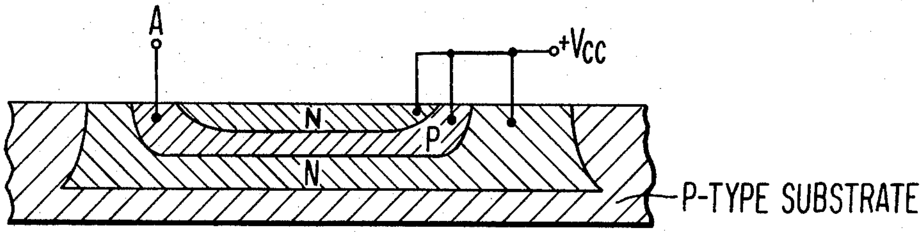

The receiver 17*a* includes a multiple emitter transistor 10; however, for the purpose of circuit simplicity, only one of the emitters is shown. That emitter is connected back to the $+V_{CC}$ terminal via an integrated circuit resistor 21 which may be of the diffused type as shown in FIG. 3 or of the pinch type as shown in FIG. 4. The connection is with the n region and one end of the p region fixed to the $+V_{CC}$ terminal 28 and the other end of the p region fixed to the emitter or A terminal as indicated in FIG. 3 or, in the case of the pinch resistor of FIG. 4, with the n, p and n regions connected at one end to the $+V_{CC}$ terminal and with the p region connected at its other end to the A terminal. In both cases, in normal operation, the resistance exhibited between the $+V_{CC}$ and the A terminals is directly proportional to the length of the p region and is inversely proportional to the cross-section of the p region. In the case of the pinch resistor, the cross-section is reduced by the upper n region so that the value of resistance, for a given length of p region, is increased. In other words, for a given integrated circuit area, the pinch resistor may be made to have a larger resistance than the diffused resistor.

In practice, the resistor 21 of FIG. 4 may be implemented in either way discussed above. Its value, regardless of how implemented may be 20,000 to 40,000 ohms or so. As there are multiple emitters, there are of course multiple interconnecting lines 19 (only one is shown), each running to a driver circuit, of which there may be many.

The receiver 17, although powered from a different power supply $V_C$ than receiver 17*a* is in other respects similar to receiver 17*a*. In other words, it too may be a multiple emitter transistor and it too may have a pinch or diffused type transistor from each emitter to the $+V_C$ terminal. Again, to simplify the drawing, only one emitter is shown.

The operation of the circuit of FIG. 5 is perfectly satisfactory so long as both power supplies remain on. However, some times during the operation, for one reason or another, for example, for purposes of maintenance, the power supply $+V_{CC}$ may be turned off while the power supply $+V_C$ remains on. It is found when this is done and it is later attempted again to turn power supply $+V_{CC}$ on, that the voltage produced by the power supply, rather than having a value of 5 or 6 volts or so, sometimes may only attain a value of from 0 to 3 volts or so. When this occurs, it is found, in addition, that heavy current flows down line 19 and because of this, other circuits, such as receiver 17, which operate from the same power supply $+V_C$ as the driver 11, do not receive adequate drive voltage and do not operate properly. These are completely unexpected results.

Upon analysis it was discovered that the reasons for this performance are as follows. While the resistors such as 21 have some relatively large value and would appear to provide a large amount of isolation between the two power supplies, in practice they do not. When one takes a closer look at the resistor 21 one sees that each such resistor comprises a p region which lies closely adjacent to one (FIG. 3) or two (FIG. 4) n regions forming p-n junctions with these regions. In normal operation, as the A terminal at one end of the p region is never more positive than the $+V_{CC}$ voltage at which the n region or regions are maintained, the diode(s) formed by the junction(s) (shown in phantom view at 23 in FIG. 4) is connected in the reverse direction and does not conduct. In other words, when both power supplies are on, the junction exhibits a high impedance and the resistor has its nominal or design value. However, when power supply $V_{CC}$ is turned off (the power supply terminal 28 is placed at ground) the signal D in the driver circuit may be relatively positive and the signal E may be relatively negative. In this case, transistor 13 is on and transistor 15 is off and current flows through the collector-to-emitter path of transistor 13 and down the interconnecting line 19 to terminal A. At terminal A, the current sees not the design value of resistance (20,000 – 40,000 ohms) but sees instead, the diode 23, poled in the forward direction, and connected at its cathode to ground. This diode, rather than exhibiting a resistance of 20,000 - 40,000 ohms, instead appears to have a relatively low value such as 200 to 1,000 ohms or so. There may be many, many such diodes connected in parallel to the terminal 28 for power supply $V_{CC}$ all conducting current. The equivalent resistance $R_L$ of all of these conducting diodes in this case will have a value comparable to the internal resistance $R_i$ of the power supply $V_{CC}$, and a relatively large current will flow down line 19.

Figure 6:
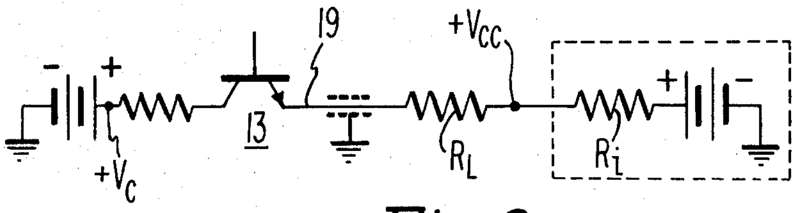
FIG. 6 is an equivalent circuit to help explain the problems solved in the present invention.

All of this is illustrated in the equivalent circuit of FIG. 6. $R_L$, the equivalent load resistor, normally has a value which is many many times higher than the internal resistance $R_I$ of the power supply. The power supply voltage $V_{CC}$ normally has some value such as 5 or 6 volts or so. However, when $V_{CC}$ is turned off and $V_C$ remains on, the effective value of the load resistor may drop to a relatively low value of the same order of magnitude as $R_I$. The current which flows increases correspondingly to some value which may be between 20 and 100 milliamperes. This reduces the voltage at the emitter of the driver transistor 13 and the reduction may be sufficient (to a value less than the threshold value of the transistors in receiver circuits such as 17) to cause improper operation of circuits such as 17 operating from power supply $V_C$. This excessive current also may cause damage of resistors such as 21 of FIG. 5. In addition, when power supply $V_{CC}$ is turned on again, because of these circuit conditions (low load resistance $R_L$ and high current flow toward $V_{CC}$) the voltage $V_{CC}$ may not return to its design value of five or six volts. Instead, this voltage may remain at from 0 to 3 volts or so, depending upon the number of resistors of the total making up $R_L$ which conduct.

The problems discovered above are solved with the improved circuit of FIG. 2. It includes all of the circuit elements of FIG. 1. In addition, the circuit of FIG. 2 includes three diodes 40, 42 and 44 connected at their cathodes to the cathodes of diodes 18, 20 and 22 and connected through resistors 46, 48 and 50, respectively, to the terminal 28 for the $+V_{CC}$ supply voltage. These elements as well as all other elements are integrated onto a common substrate 52, which may be connected to a reference voltage level such as ground. The resistors may be of the diffused or pinch types, as examples.

In the normal operation of the circuit of FIG. 2, if there is an unused terminal such as C it is left "floating." The diode 44 and resistor 50 maintain this terminal always at a positive voltage level somewhat lower than $+V_{CC}$. Current flows from the voltage supply terminal 28 through resistor 50 through diode 44 and through the relatively high impedance leakage path from emitter 16 to ground. Resistor 50 may have some value such as 20,000 ohms — a value substantially lower than the value of the leakage path from the emitter 16 to ground. Resistors 46 and 48 may have the same value as resistor 50 and it is not essential that these values be absolutely identical, The reason is that the leakage current path is of so much higher impedance than any of resistors 46, 48 or 50 that minor variations in the values of these resistors do not substantially affect the quiescent voltage level at the emitters — they all assume about the same positive voltage level.

The diodes 40, 42 and 44 prevent the disadvantageous performance discussed at length above. If the power supply terminal 28 is placed at ground, for example, and current should attempt to flow from a driver circuit through any of the resistors 46, 48 or 50 to terminal 28, the diodes 40, 42 and 44 prevent this. They are poled in the reverse direction with respect to such current flow. Accordingly, power supply $V_{CC}$ can be turned off at any time and later turned on again to its normal operating level.

What is claimed is:

1. An input circuit to a multiple-emitter transistor circuit of the type receiving input signals at said emitters and in which the base is connected to a voltage supply terminal for an operating voltage $V_{CC}$ comprising, in combination:

a plurality of first diodes, each connected to a different emitter, each poled in the reverse direction relative to the emitter-to-base diode to which it is connected, and each coupled between an emitter and a point of reference potential;

a like plurality of second diodes, each second diode connected like-electrode-to-like-electrode to a different one of the first diodes; and a plurality of direct current impedances, all connected at one terminal to a voltage supply terminal and each connected at its other terminal to the other electrode of a different one of said second diodes.

2. In combination with a multiple emitter transistor which is connected at its base to a supply voltage terminal and which is adapted to receive input signals at its emitters:

a number of first diodes equal to the number of emitters, respectively coupled between said emitters and ground, each diode poled in the reverse direction relative to the emitter-to-base diodes of said transistor;

the same number of second diodes respectively connected to said first diodes, like electrode-to-like-electrode; and the same number of resistors connected from said supply voltage terminal to the respective other electrodes of said second diodes.

3. In the combination as set forth in claim 2, all of the elements set forth being integrated onto common substrate, said common substrate being connected to ground.

4. In combination:

driver circuits operated from one power supply; and a receiver circuit operated from a second power supply and connected to said driver circuits, said receiver circuit comprising:

a multiple emitter transistor connected at its base to said second power supply and at its emitters to said driver circuits; and a plurality of series circuits, each comprising a non-linear resistance means in series with a diode, each series circuit connected between said second power supply and a different emitter, respectively, the diode of a series circuit poled to conduct the second power supply current in the forward direction and said non-linear resistance means exhibiting a relatively high impedance for this direction of current flow and a relatively low impedance for the opposite direction of current flow.

5. An integrated circuit comprising, in combination:

a multiple emitter transistor, having also a base;

a power supply terminal;

a resistor connected between said terminal and said base; and a plurality of circuits each connected between a different emitter and said power supply terminal, each circuit comprising a non-linear resistance in series with an asymmetrically conducting element, said non-linear resistance comprising a first diffusion of one conductivity type serving as a resistor and a second diffusion of different conductivity type forming a junction with said first diffusion and operating as a diode in shunt with said resistor poled to conduct the power supply current in the reverse direction and said asymmetrically conducting element comprising a diode serving as an isolating device and poled to conduct the power supply current in the forward direction.

6. In the combination set forth in claim 4, said non-linear resistance means comprising a first diffusion of one conductivity type serving as a resistor and a second diffusion of different conductivity type forming a junction with said first diffusion and operating as a diode in shunt with said resistor poled to conduct current in said opposite direction of current flow, that is, in a direction from the emitter of said transistor to said second power supply.

7. In the combination as set forth in claim 4, further including a plurality of second diodes, each second diode connected between an emitter and a point of reference potential, each second diode connected in the reverse direction relative to said second power supply.

* * * * *